United States Patent [19]

Shinozaki et al.

[11] Patent Number: 5,546,027

[45] Date of Patent: Aug. 13, 1996

[54] PEAK DETECTOR

[75] Inventors: Eiji Shinozaki; Kiyoshi Fukahori, both of Tokyo; Masafumi Kurisu, Kanagawa, all of Japan

[73] Assignee: Silicon Systems, Inc., Tustin, Calif.

[21] Appl. No.: 355,055

[22] Filed: Dec. 12, 1994

[51] Int. Cl.$^6$ .................................................. H03K 5/153
[52] U.S. Cl. ..................... 327/59; 327/62; 327/73
[58] Field of Search ................... 327/57, 60, 62, 327/73

[56] References Cited

U.S. PATENT DOCUMENTS

5,331,210   7/1994   McCarroll ........................... 327/73
5,428,307   6/1995   Dendinger .......................... 327/73

Primary Examiner—Margaret Rose Wambach
Attorney, Agent, or Firm—Blakely, Sokoloff, Taylor & Zafman

[57] ABSTRACT

The peak voltage detector according to the present invention includes (a) an input and output terminals, (b) a comparator for comparing the input terminal voltage to the output terminal voltage, (c) a hold capacitor coupled to the output terminal, and (d) a charge pump coupled between the comparator and the hold capacitor. The charge pump has (i) a current reduction circuit for reducing a charge current that charges the hold capacitor, (ii) a differential input pair for receiving the output voltages of the comparator, (iii) a current mirror for mirroring a current in the differential input pair to the charge current, and (iv) a current source. To detect the peak of the input terminal voltage, the peak voltage detector of the present invention compares the input terminal voltage to the output terminal voltage, and charges the output terminal when the input terminal voltage is greater than the output terminal voltage until the output terminal voltage is substantially equal to the input terminal voltage. As the output terminal voltage increases, the level of the charge current that charges the hold capacitor is reduced, thus producing a smaller error in the acquired voltage at the output terminal. To reduce the error further in the acquired output terminal voltage, the peak voltage detector of the present invention may also have a leakage current coupled between the output terminal and ground.

24 Claims, 4 Drawing Sheets

FIG. 8

PEAK DETECTOR

BACKGROUND OF THE INVENTION

1. Field of the Invention

The present invention relates to peak voltage detectors, and more particularly, to peak detectors wherein high accuracy and minimum susceptibility to noise are desired.

2. Description of the Related Art

Figure 1:
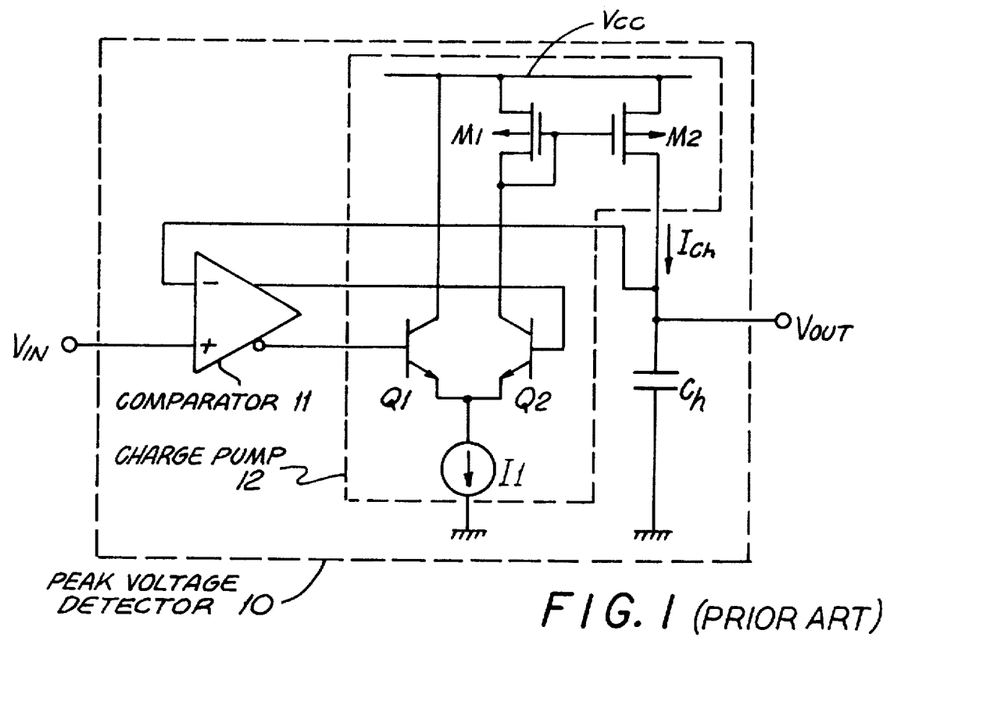
FIG. 1 is a circuit diagram of a prior art peak voltage detector.

FIG. 1 shows a typical prior art peak voltage detector 10 which consists of a comparator 11, a charge pump 12 and a hold capacitor $C_h$. When $V_{in}$ is greater than $V_{out}$, the noninverting output of the comparator will be high and the inverting output will be low. This turns transistor Q1 off and transistor Q2 on. Current I1 thus flows through transistors M1 and Q2, with the current in transistor M1 being mirrored by transistor M2 as current $I_{ch}$. While transistor Q2 is on, $I_{ch}$ flows into capacitor $C_h$ to charge $C_h$. When $V_{in}$ is less than $V_{out}$, the inverting output of the comparator will be high and the noninverting output will be low. Transistor Q1 is now on and transistor Q2 is off. Now current I1 will flow directly from $V_{cc}$ through transistor Q1. The current in transistor Q2 and thus the current $I_{ch}$ will be zero, and capacitor $C_h$ will hold the previous voltage.

Figure 2:
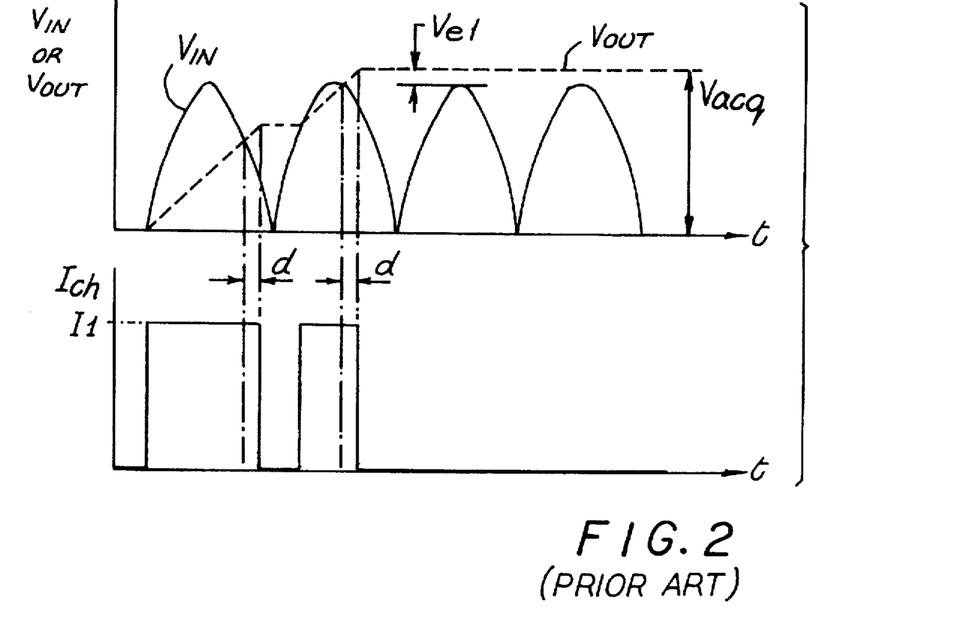
FIG. 2 presents the waveforms of the input and output voltages and the respective charge current of the peak voltage detector shown in FIG. 1.

FIG. 2 shows the voltage and current waveforms for the circuit of FIG. 1. One of the disadvantages of the prior art described above is that the output voltage $V_{out}$ is almost always higher than the actual peak value of $V_{in}$. This is because comparator 11 cannot respond instantaneously to its inputs. As a result, even after $V_{out}$ becomes greater than $V_{in}$, $I_{ch}$ stays on for a finite time delay (d), as shown in FIG. 2. During the finite time delay (d), capacitor $C_h$ continues to be charged. This results in an error voltage $V_{e1}$. The amount of overshoot represented by $V_{e1}$ depends on the magnitude of I1, the delay d and the size of capacitor $C_h$.

Figure 3:
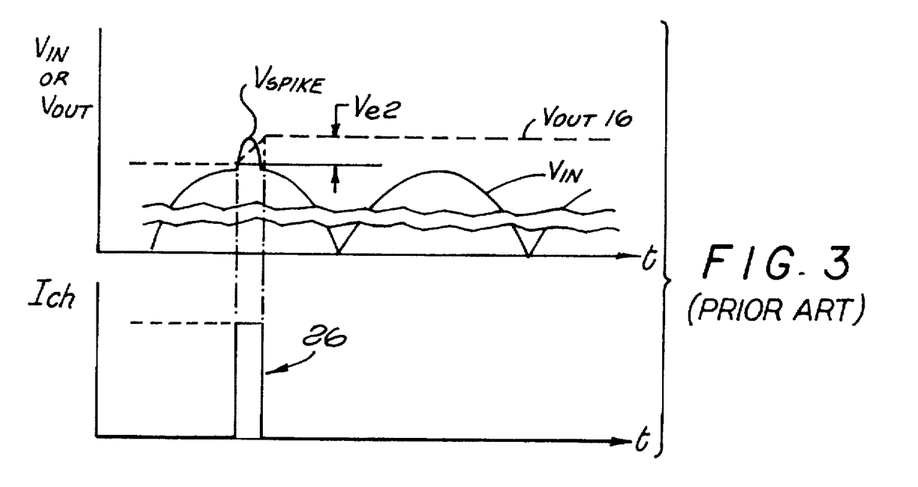
FIG. 3 presents the waveforms of the input voltage with a voltage spike and the corresponding output voltage and the current induced by the voltage spike of the peak voltage detector shown in FIG. 1.

Another disadvantage of the prior art is that the topology shown in FIG. 1 is highly susceptible to noise spikes occurring near the peaks of $V_{in}$ after the true peak has been captured by capacitor $C_h$. FIG. 3 presents the voltage waveform of $V_{in}$ with a voltage spike $V_{spike}$ occurring near the peak of $V_{in}$ and the voltage waveform of $V_{out}$. FIG. 3 also shows the resulting current pulse 26 developed in $I_{ch}$ due to the voltage spike $V_{spike}$. Current pulse 26 further charges capacitor $C_h$ and creates an error voltage $V_{e2}$ in the output voltage $V_{out}$.

To overcome the drawbacks of the prior art described above, the present invention provides a current reduction circuit and a small leakage current to reduce the amount of error in the output voltage occurring due to the noise spikes in the input voltage and the characteristics of a non-ideal comparator.

SUMMARY OF THE INVENTION

The present invention provides methods and apparatus for detecting a peak voltage with high accuracy and minimum susceptibility to noise.

The peak voltage detector according to the present invention includes an input terminal and an output terminal, a comparator for comparing the input terminal voltage and the output terminal voltage, the comparator having the input terminal voltage and the output terminal voltage as inputs and first and second complementary comparator output voltages as outputs, a hold capacitor coupled to the output terminal, and a charge pump coupled between the comparator and the hold capacitor.

The charge pump of the present invention has a differential input pair for receiving the first and second comparator output voltages as inputs, a current mirror for mirroring a current in the differential input pair to the charge current, a current reduction circuit for reducing the charge current that charges the hold capacitor responsive to inputs from the input and output terminals, and a current source coupled between the current reduction circuit and ground.

To detect the peak of the input terminal voltage, the peak voltage detector of the present invention compares the input terminal voltage to the output terminal voltage, and charges the output terminal when the input terminal voltage is greater than the output terminal voltage until the output voltage is substantially equal to the input terminal voltage. As the output terminal voltage approaches the input terminal voltage, the level of the charge current that charges the hold capacitor is substantially and smoothly reduced for increasing output terminal voltages, thus minimizing the error in the acquired output voltage due to the non-ideal comparator and noise at the input terminal.

To reduce the error in the output voltage further, the peak voltage detector of the present invention may also have a leakage current coupled between the output terminal and ground.

DETAILED DESCRIPTION OF THE INVENTION

Figure 4:
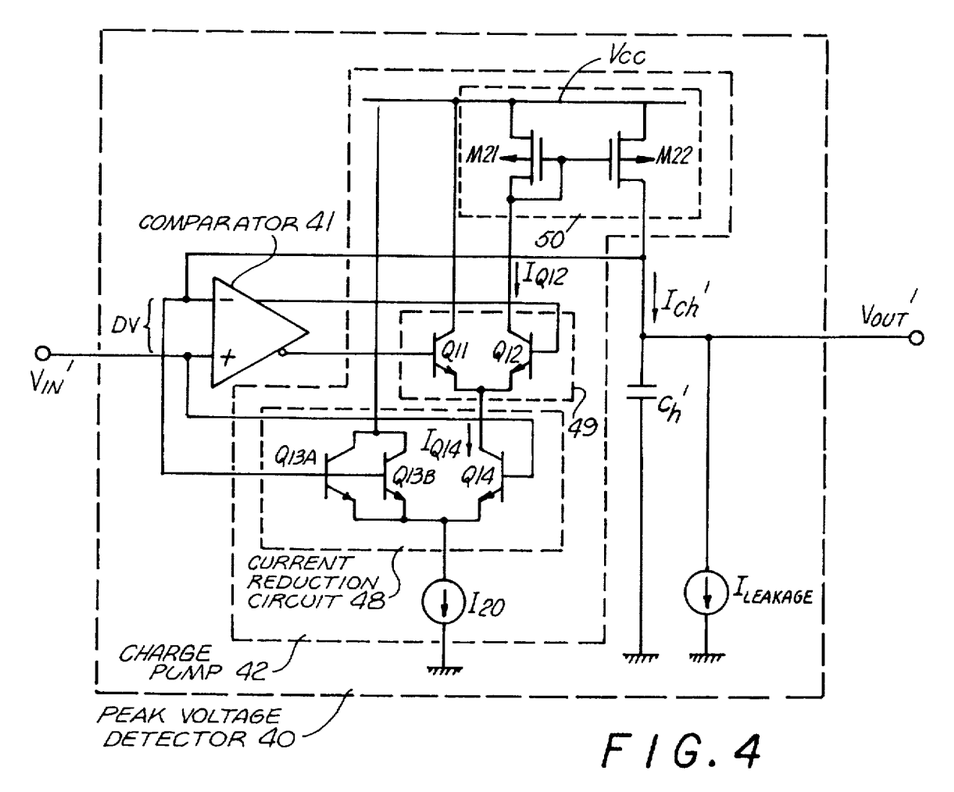
FIG. 4 is a circuit diagram of a peak voltage detector according the present invention, the FIG. 5 is the waveform of the current through the current reduction circuit as a function of the difference between the input and output voltages of the circuit of FIG. 4.

FIG. 4 shows a peak voltage detector 40 according to one embodiment of the present invention, having a current reduction circuit 48 for reducing the charge current $I_{ch}'$ as the difference voltage $V_{in}'-V_{out}'$ becomes smaller. Peak voltage detector 40 includes a comparator 41, a charge pump 42 and a charge capacitor $C_h'$.

Comparator 41 compares $V_{in}'$ and $V_{out}'$, with each of the complementary outputs thereof provided to the respective transistor of differential pair 49 in charge pump 42. The inputs $V_{in}'$ and $V_{out}'$ to comparator 41 are also provided to current reduction circuit 48 within charge pump 42.

Charge pump 42 includes current reduction circuit 48, differential input pair 49 consisting of transistors Q11 and Q12, and a current mirror 50. If $V_{in}'$ is greater than $V_{out}'$, then transistor Q11 will be off and transistor Q12 will be on. The fraction of the current I20 which will flow through transistors Q12 and M21 to be mirrored to transistor M22 as the current $I_{ch}'$ will depend, however, on the current reduction circuit 48. If, on the other hand, $V_{in}'$ is smaller than $V_{out}'$, then transistor Q11 will be on and transistor Q12 will be off, turning off $I_{ch}'$ in any event. In this case capacitor $C_h'$ will retain its previous charge (voltage).

Current reduction circuit 48 includes identical transistors Q13A, Q13B and Q14. When $V_{in}'$ is substantially greater than $V_{out}'$ during the peaks of $V_{in}'$, the base of transistor Q14 will be at a substantially higher voltage than the bases of transistors 13A and 13B, turning on transistor Q14 and turning off transistors Q13A and Q13B. Also transistor Q12 will be on and transistor Q11 will be off. Consequently the current I20 will flow through transistors Q12 and M21, and be mirrored to transistor M22 as charging current $I_{ch}'$.

As $V_{out}'$ increases to approach the peaks of $V_{in}'$, the voltage on the bases of transistors Q13A and Q13B during the peaks will approach the voltage on the base of transistor 14, starting to turn on transistors Q13A and Q13B. Now the voltage of the common emitter connection of transistors Q13A, Q13B and Q14 will adjust to reduce the current in transistor Q14 below I20, so that the current I20 divides between transistors Q13A, Q13B and Q14. The part of I20 that flows through transistors Q13A and Q13B is not mirrored to the charging current $I_{ch}'$, with the net result that the charging current $I_{ch}'$ will be less than I20 by an amount dependent on the relative values of $V_{in}'$ and $V_{out}'$ and the number of transistors Q13, as more or fewer can be used.

Figure 5:
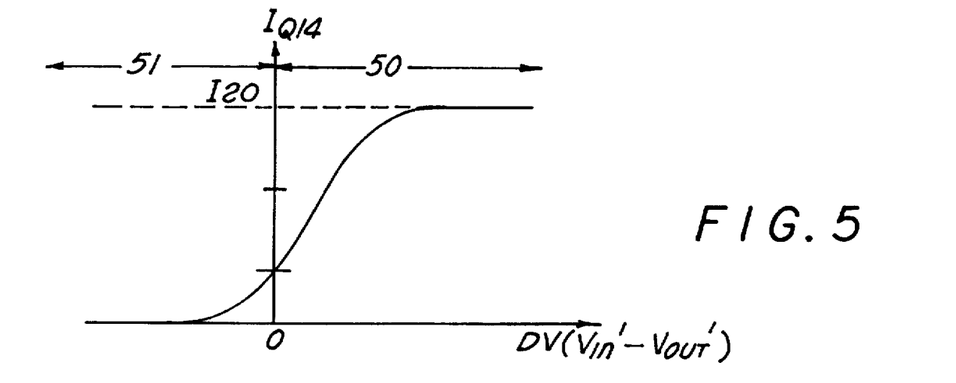

When $V_{out}'$ increases to nearly equal the peaks of $V_{in}'$, the voltage on the bases of transistors Q13A and Q13B during the peaks will nearly equal the voltage on the base of transistor Q14. Now the current I20 divides nearly equally among transistors Q13A, Q13B and Q14, each conducting a third of I20. Again the part of I20 that flows through transistors Q13A and Q13B is not mirrored to the charging current $I_{ch}'$, with the net result that the charging current $I_{ch}'$ will be approximately one third of I20. (or I20 divided by N+1, where N is the number of transistors Q13 if more or fewer are used). Thus as shown in FIG. 5, the current $I_{Q14}$ in transistor Q14 becomes smaller as the difference voltage $V_{in}'-V_{out}'$ becomes smaller in region 50. As a result, as $V_{in}'-V_{out}'$ gets smaller, $I_{ch}'$ becomes smaller, charging capacitor $C_h'$ at a lower rate. Hence, the present invention allows $V_{out}'$ to "soft land" to its final value.

If $V_{out}'$ exceeds the peaks of $V_{in}'$ (off peak or due to prior noise at a peak of $V_{in}'$), the comparator will begin to shut off transistor Q12 and turn on transistor Q11, so that the still further reduced current in transistor Q14 (region 51 of FIG. 5) will flow through transistor Q11, not transistor Q12, thereby terminating the charging current $I_{ch}'$.

Figure 6A:
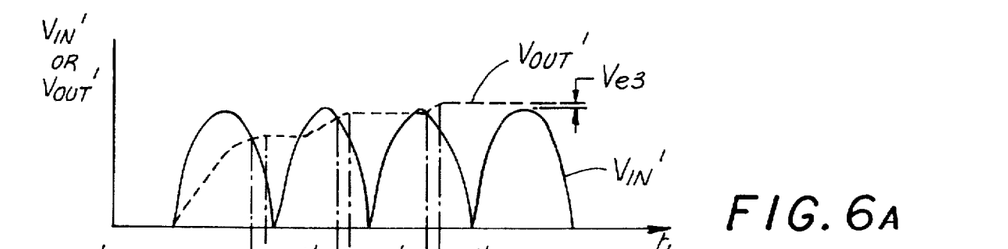
FIG. 6 presents the waveforms of the input and output voltages and associated charge current of the peak voltage detector shown in FIG. 4.
Figure 6B:
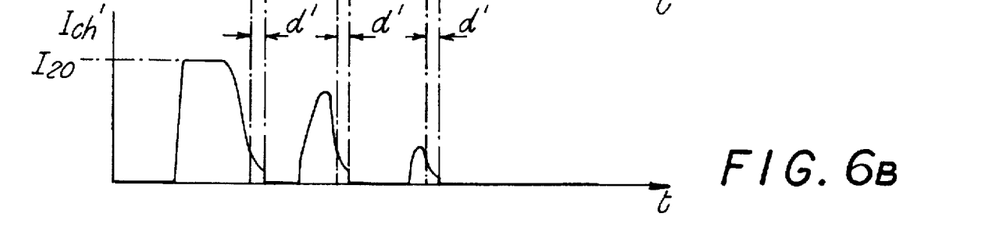

FIG. 6 presents the voltage waveforms of $V_{in}'$ and $V_{out}'$, and the associated current waveform of $I_{ch}'$. Because the current reduction circuit 48, Ich' becomes smaller as the value of $V_{out}'$ becomes closer to the value of $V_{in}'$. Since comparator 41 is not ideal, there is still a certain amount of delay d', but during the delay period d', because the charging current $I_{ch}'$ is substantially smaller than the charging current $I_{ch}$ in the prior art of FIG. 2, the error voltage $V_{e3}$ created in the present invention is much smaller than the error voltage $V_{e1}$ of the prior art.

Figure 7A:
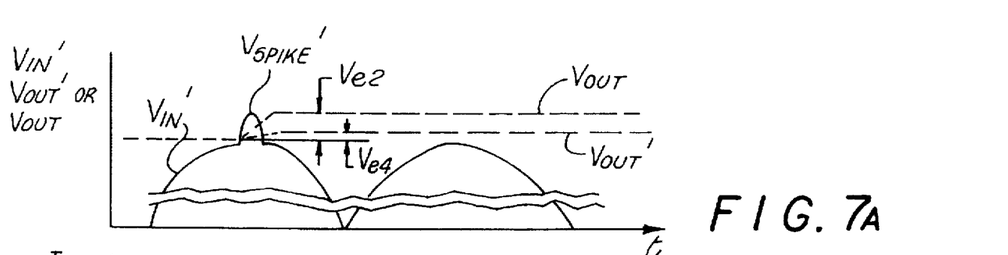
FIG. 7A presents the waveform of the input voltage with a voltage spike and the comparison of the corresponding output voltage waveforms according to the prior art and the present invention.
Figure 7B:
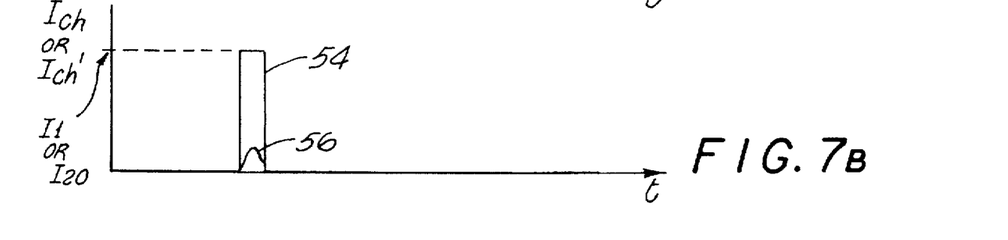
FIG. 7B presents the waveforms of the charge current due to the voltage spike in FIG. 7A according to the prior art and the present invention.

FIGS. 7A and 7B present a comparison between the error voltage of the present invention and the error voltage of the prior art created by noise in the input voltage. FIG. 7A presents the voltage waveform of an input voltage $V_{in}'$ having a $V_{spike}'$ occurring near the peak of $V_{in}'$, and the corresponding voltage wave forms of Vout of the prior art and $V_{out}'$ of the present invention. FIG. 7B presents the resulting prior art current pulse 54 and the present invention's current pulse 56 created by $V_{spike}'$. In the prior art, after the true peak of the input voltage is captured, current pulse 54 due to $V_{spike}'$ is at the full amplitude of current source 11. However, in the present invention, after the true peak of the input voltage is captured, since the value of $V_{out}'$ is close to the value of $V_{in}'$, current pulse 56 due to $V_{spike}'$ is small. Current pulse 56 is substantially less than the level of the current source (11 or I20), as shown in FIG. 7B. Thus, the resulting error voltage $V_{e4}$ of the present invention is much less than error voltage $V_{e2}$ of the prior art for a given noise level in the input wave $V_{in}'$.

A straight-forward implementation of the circuit of FIG. 4 does not allow operation of the circuit at less than 3 volts. In particular, current I20 in FIG. 4 flows through the differential amplifier comprised of bipolar transistors Q13A, Q13B and Q14. To achieve stable operation, the current source I20 will require at least 0.5 v across it, and the Vce of Q14 will also require 0.5 V or more. Also the base voltages of Q11 and Q12 will dictate the voltage drops allowed across Q14 and the current source I20. Consequently the design of the peak voltage detector in the form shown in FIG. 4 for low supply voltage operation becomes very difficult. However, FIG. 8 shows an alternate circuit implementation for the circuit of FIG. 4 which accommodates low supply voltage operation.

Figure 8:
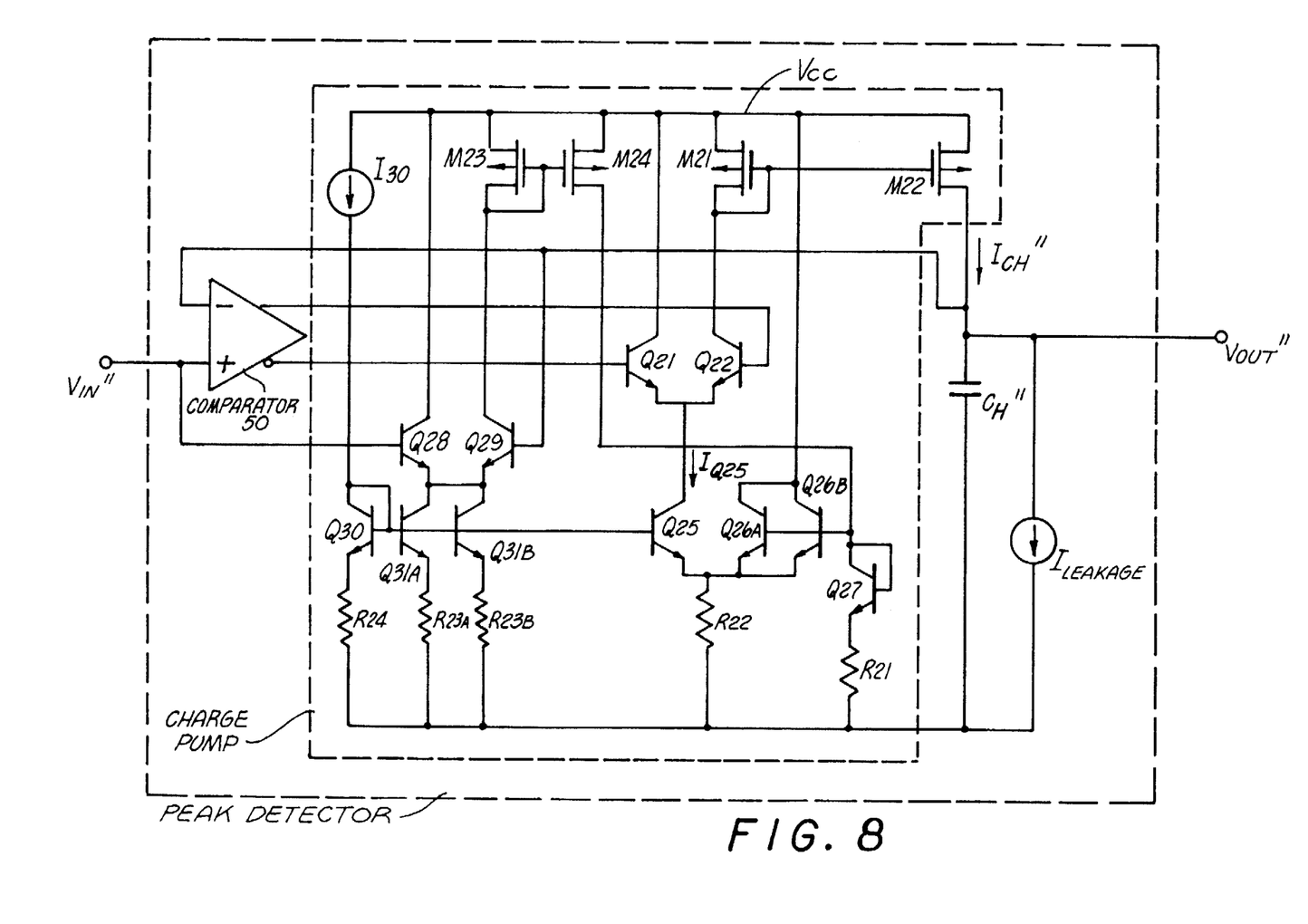
FIG. 8 is an alternate circuit implementation for the circuit of FIG. 4 which accommodates low supply voltage operation.

In the embodiment of FIG. 8, transistors Q25, Q26A, Q26B, Q27, Q30, Q31A and Q31B are identical, and the resistors R21, R22, R23A, R23B and R24 are the same size. The current of current source 130 flows through transistor Q30 and resistor R24, setting the base voltage of transistor Q30 and thus the base voltage of transistors Q31A, Q31B and Q25. This in turn sets the current through transistors Q31A and Q31B, though the division between transistors Q28 and Q29 of the current through transistors Q31A and Q31B depends upon the difference between the output voltage VOUT" and the input voltage VIN". In particular, in the region of peaks, and when the output voltage is initially considerably lower than the input voltage, transistor Q28 will be substantially on and transistor Q29 will be substantially off. With transistor Q29 off, transistor M23 does not mirror any current to transistor M24 and accordingly transistors Q26A and Q26B will be off. Thus, the current IQ25 through transistor Q25 and resistor R22 will equal the current through each of transistors Q31 and the associated resistor R23. Since the positive input to the comparator 50 is higher than the negative input, the output of the comparator holds transistor Q22 on and holds transistor Q21 off. Consequently, the current IQ25 through transistor Q25 will also flow through transistors Q22 and M21, to be mirrored to transistor M22-to provide the charging current $I_{ch}$ " to charge the capacitor CH" to drive the output VOUT" toward the intended peak value.

As VOUT" approaches the voltage of the peak of the input voltage VIN", Q29 will begin to turn on, with the voltage of the common emitter connection of transistors Q28 and Q29 readjusting to reduce the current through transistor Q28. The current through Q29 is mirrored by transistors M23 and M24 to transistor Q27 which in turn is mirrored to transistors Q26A and Q26B. This current, which flows through resistor R22 as one of the current components therein, provides part of the voltage drop across resistor R22. Since the base voltage of transistor Q25 is set by the current source I30 to be equal to the VBE of transistor Q30 plus the voltage drop across resistor R24, and the emitter voltage of transistor Q25 is 1 VBE below the base voltage of transistor Q25, the voltage across R22 and thus the total current through resistor R22 is set. Consequently the larger the current component through transistors Q26A and Q26B, the smaller the current component IQ25 through transistor Q25, which of course so long as VOUT" is less than VIN" (Q22 on and Q21 off), will flow through Q22. This current will be mirrored by transistors M21 and M22 to provide the output charging current $I_{ch}$", thereby providing the same soft landing at the peak voltage as hereinbefore described with respect to FIGS. 4 and 5. Of course when VOUT" exceeds VIN", even at the peaks of VIN", Q22 will remain off even during the peaks in the input voltage, and transistor Q22 will be off and transistor Q21 will be on, so that any current flow IQ25 through transistor Q25 will be directly from VCC through transistor Q21 and not through transistor Q22. Thus no current component in transistor Q22 will be mirrored by transistors M21 and M22 to the output. In the circuit of FIG. 8, since the current through transistor Q25 is equivalent to the current IQ14 of FIG. 4, the need for the standoff voltage for either Q14 or I20 of FIG. 4 is eliminated. The voltage across transistor Q25 still needs to be 0.5 volt.

To avoid the accumulation of the effects of noise at and near the peak of the input signal, a small leakage current is provided to capacitor $C_h$. In particular, as shown in FIGS. 4 and 8, the output of the peak detector provided to the holding capacitor C is also connected through a current source to ground so as to provide the small leakage current $I_1$ constantly discharging the capacitor. This leakage current may be provided by a resistor to ground, or by way of an active current source, the design of which are well known. In any event, the leakage current avoids the accumulation of the effects of noise spikes at or near the peaks which could create inaccurately high peak detection values. While the leakage current could, depending on its magnitude, decrease the detected peak below that actually present, such a decrease at most would be only a small percentage of the total signal and would be uniform servo burst to servo burst, and therefore would not affect the relative amplitude measurements.

While the present invention has been particularly described with reference to the various figures, it should be understood that the figures are for illustration only and should not be taken as limiting the scope of the invention. Many changes and modifications may be made to the invention, by one having ordinary skill in the art, without departing from the spirit and scope of the invention as disclosed herein.

What is claimed is:

1. A peak voltage detector comprising:

an input terminal, an output terminal and a circuit ground;

a comparator for comparing the voltage of the input terminal and the voltage of the output terminal and for providing a comparator output responsive thereto;

a hold capacitor coupled between said output terminal and ground; and, a charge pump coupled between said comparator output and said hold capacitor for directing a variable charge current to said hold capacitor when the voltage of the input terminal exceeds the voltage of the output terminal, said charge pump including a current reduction circuit coupled to said input and output terminals for reducing the variable charge current as the voltage of the output terminal approaches the voltage of the input terminal.

2. The peak voltage detector of claim 1 wherein said charge pump includes a source of current, said current reduction circuit being a circuit for splitting current responsive to said current source into first and second current components, the first current component being a decreasing part and the second current component being an increasing part of the current responsive to said current source as the voltage of the output terminal approaches the voltage of the input terminal, the charge current being responsive to the first current component.

3. The peak voltage detector of claim 2 wherein the first current component is mirrored to provide the charge current.

4. The peak voltage detector of claim 3 wherein the current reduction circuit includes first and second transistors coupled to the current source and coupled differentially to be responsive to the voltages of the input and the output terminals, respectively, the first transistor being coupled so that the first current component flows therethrough.

5. The peak voltage detector of claim 4 wherein the second transistor comprises a plurality of transistors connected in parallel.

6. The peak voltage detector of claim 1 further comprised of a source of leakage current coupled to the hold capacitor.

7. A peak voltage detector comprising:

an input terminal, an output terminal and a circuit ground;

a comparator for comparing the voltage of the input terminal and the voltage of the output terminal and for providing complementary comparator outputs responsive thereto;

a hold capacitor coupled between said output terminal and ground;

first and second transistors coupled to the complementary outputs of the comparator so that the first transistor is turned off and the second transistor is turned on when the voltage on the input terminal is higher than the voltage on the output terminal, and the first transistor is turned on and the second transistor is turned off when the voltage on the input terminal is lower than the voltage on the output terminal, the current in the second transistor being coupled to the output terminal to provide a charge current for the hold capacitor;

third and fourth transistors coupled as a differential pair and each having their inputs coupled to one of the input and output terminals;

a current source coupled to the third and fourth transistors to provide a current there through variably divisible between the third and fourth transistors dependent upon the relative voltages on the output and input terminals, respectively;

the first and second transistors being coupled to the fourth transistor so that the current through the first and second transistors is responsive to the current through the fourth transistor.

8. The peak voltage detector of claim 7 wherein the current through the second transistor is mirrored to the output terminal.

9. The peak voltage detector of claim 7 wherein the current source is directly connected to the third and fourth transistors.

10. The peak voltage detector of claim 7 wherein the current of the current source is mirrored to the third and fourth transistors.

11. The peak voltage detector of claim 7 wherein the first and second transistors are directly coupled to the fourth transistor so that the current through the combination of first and second transistors is equal to the current through the fourth transistor, and wherein the third and fourth transistors have their inputs coupled to the output and input terminals, respectively.

12. The peak voltage detector of claim 7 wherein the current in the current source and the current through the fourth transistor are mirrored so that the sum of currents through the first and second transistors is the difference between the current mirrored from the current source and the current mirrored from the fourth transistor, the third and fourth transistors having their inputs coupled to the input and output terminals, respectively.

13. The peak voltage detector of claim 7 further comprised of a source of leakage current coupled to the hold capacitor.

14. A peak voltage detector comprising:
   an input terminal, an output terminal and first and second power supply terminals;
   a comparator for comparing the voltage of the input terminal and the voltage of the output terminal and for providing complementary comparator outputs responsive thereto;
   a hold capacitor coupled between said output terminal and one of the power supply terminals;
   first and second transistors coupled to the complementary outputs of the comparator so that the first transistor is turned off and the second transistor is turned on when the voltage on the input terminal is higher than the voltage on the output terminal, and the first transistor is turned on and the second transistor is turned off when the voltage on the input terminal is lower than the voltage on the output terminal, the current in the second transistor being coupled to the output terminal to provide a charge current for the hold capacitor;
   third and fourth bipolar transistors, each having an emitter, a base and a collector, the collector of the third transistor being coupled to the first power supply terminal and the collector of the fourth transistor being coupled to the first and second transistors, the base of the third transistor being coupled to the input terminal and the base of the fourth transistor being coupled to the output terminal;
   a current source coupled to the emitters of the third and fourth transistors to provide a current there through variably divisible between the third and fourth transistors dependent upon the relative voltages on the output and input terminals, respectively;
   the first and second transistors being coupled to the fourth transistor so that the sum of the currents through the first and second transistors is responsive to the current through the fourth transistor.

15. The peak voltage detector of claim 14 wherein the first and second transistors are also bipolar transistors.

16. The peak voltage detector of claim 14 wherein the current through the second transistor is mirrored to the output terminal.

17. The peak voltage detector of claim 14 further comprised of a source of leakage current coupled to the hold capacitor.

18. A peak voltage detector comprising:
   an input terminal, an output terminal and first and second power supply terminals;
   a comparator for comparing the voltage of the input terminal and the voltage of the output terminal and for providing complementary comparator outputs responsive thereto;
   a hold capacitor coupled between said output terminal and one of the power supply terminals;
   first and second transistors coupled to the complementary outputs of the comparator so that the first transistor is turned off and the second transistor is turned on when the voltage on the input terminal is higher than the voltage on the output terminal, and the first transistor is turned on and the second transistor is turned off when the voltage on the input terminal is lower than the voltage on the output terminal, the current in the second transistor being coupled to the output terminal to provide a charge current for the hold capacitor;
   third and fourth bipolar transistors, each having an emitter, a base and a collector, the collector of the third transistor being coupled to the first power supply terminal and the collector of the fourth transistor being coupled to the first and second transistors, the base of the third transistor being coupled to the input terminal and the base of the fourth transistor being coupled to the output terminal;
   a current source mirrored to the emitters of the third and fourth transistors to provide a current there through variably divisible between the third and fourth transistors dependent upon the relative voltages on the output and input terminals, respectively, the current in the collector of the fourth transistor and the current of the current source being mirrored so that the current through the first and second transistors is equal to the weighted difference between the current in the collector of the fourth transistor and the current of the current source.

19. The peak voltage detector of claim 18 wherein the first and second transistors are also bipolar transistors.

20. The peak voltage detector of claim 18 wherein the current through the second transistor is mirrored to the output terminal.

21. The peak voltage detector of claim 18 further comprised of a source of leakage current coupled to the hold capacitor.

22. A method of providing an output that is the peak of an input comprising the steps of:
   (a) providing a hold capacitor;
   (b) providing transistors connected as a differential pair having their differential inputs connected to the input and the output;
   (c) providing a combined current through the differential pair so that the current may divide between the differential pair dependent on the differential input thereto to provide a first variable current;
   (d) switching a second variable current to the output responsive to the current in one of the differential pair when the voltage of the input is greater than the voltage of the output, and not when the voltage of the input is less than the voltage of the output, the second variable current switched to the output being greatest when the voltage of the input is substantially greater than the voltage of the output.

23. The method of claim 22 wherein the transistors connected as a differential pair are a pair of bipolar transistors having their emitters connected together and their bases connected to the input and the output, respectively, whereby both transistors will not be conducting unless the voltages of the input and the output are close to each other.

24. The method of claim 22 further comprised of the step of providing a leakage current to the hold capacitor.

* * * * *

UNITED STATES PATENT AND TRADEMARK OFFICE
CERTIFICATE OF CORRECTION

PATENT NO. : 5,546,027
DATED : August 13, 1996
INVENTOR(S) : Shinozaki et al.

It is certified that error appears in the above-identified patent and that said Letters Patent is hereby corrected as shown below:

In column 5 at line 36, please delete " $C_{is}$ " and insert -- $C_h$ is --.

In column 6, claim 4 at line 25, please delete " therethrough " and insert -- there through --.

In column 8, claim 22 at line 63, please delete " the current " and insert -- the first variable current --.

Signed and Sealed this

Tenth Day of December, 1996

Attest:

BRUCE LEHMAN

*Attesting Officer*    *Commissioner of Patents and Trademarks*